United States Patent
Matsumoto

(10) Patent No.: US 11,489,551 B2
(45) Date of Patent: Nov. 1, 2022

(54) RADIO-FREQUENCY MODULE AND COMMUNICATION DEVICE

(71) Applicant: Murata Manufacturing Co., Ltd., Nagaokakyo (JP)

(72) Inventor: Naoya Matsumoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/225,131

(22) Filed: Apr. 8, 2021

(65) Prior Publication Data

US 2021/0409062 A1 Dec. 30, 2021

(30) Foreign Application Priority Data

Jun. 26, 2020 (JP) .............................. JP2020-110290

(51) Int. Cl.
*H04B 1/40* (2015.01)
*H03F 3/24* (2006.01)
*H03F 1/02* (2006.01)
*H03F 1/30* (2006.01)
*H03F 1/56* (2006.01)
*H01L 23/66* (2006.01)
*H04B 1/04* (2006.01)

(52) U.S. Cl.
CPC .............. *H04B 1/40* (2013.01); *H01L 23/66* (2013.01); *H03F 1/0211* (2013.01); *H03F 1/30* (2013.01); *H03F 1/565* (2013.01); *H03F 3/245* (2013.01); *H01L 2223/6655* (2013.01); *H03F 2200/222* (2013.01); *H03F 2200/294* (2013.01); *H03F 2200/451* (2013.01); *H03F 2200/468* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 9,131,634 B2 * | 9/2015 | Hadjichristos | H01L 25/16 |
| 9,478,858 B1 * | 10/2016 | West | G01S 7/414 |
| 10,643,962 B1 * | 5/2020 | Ichitsubo | H03F 3/72 |
| 11,251,829 B2 * | 2/2022 | Harada | H04B 1/50 |
| 2018/0226361 A1 * | 8/2018 | Chen | H01L 23/552 |
| 2020/0321929 A1 * | 10/2020 | Daimon | H03F 3/195 |

FOREIGN PATENT DOCUMENTS

JP 2018-137522 A 8/2018

* cited by examiner

*Primary Examiner* — Thomas J. Hiltunen
(74) *Attorney, Agent, or Firm* — Xsensus LLP

(57) ABSTRACT

A radio-frequency module includes a module substrate, a power amplifier, and a control circuit configured to control the power amplifier. The control circuit includes a temperature sensor. The power amplifier and the control circuit are stacked one on top of another on a principal surface of the module substrate.

17 Claims, 4 Drawing Sheets

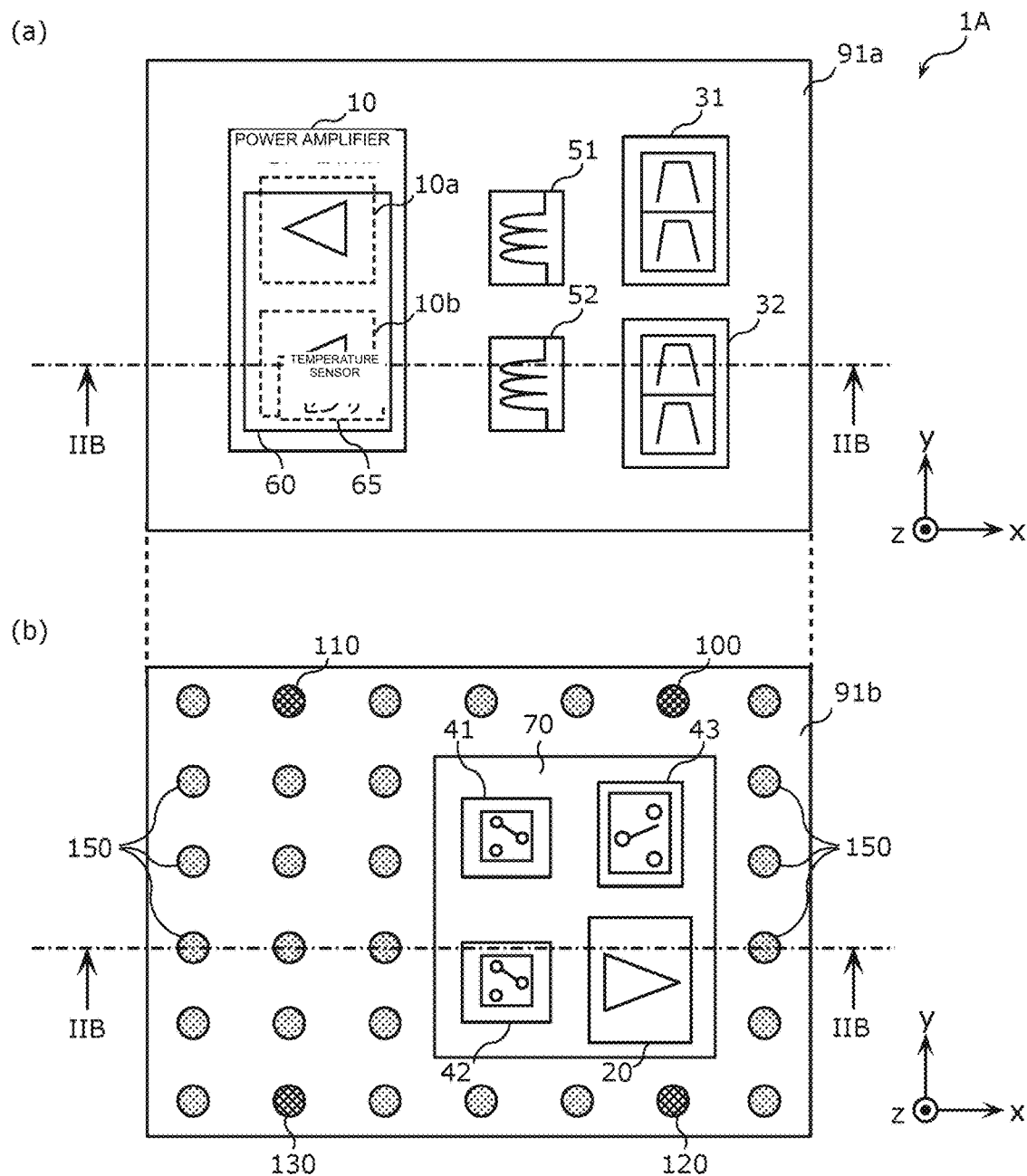

RADIO-FREQUENCY MODULE AND COMMUNICATION DEVICE

CROSS-REFERENCE TO RELATED APPLICATION

The present application claims priority to Japanese patent application JP2020-110290, filed Jun. 26, 2020, the entire contents of which being incorporated herein by reference.

BACKGROUND

1. Field

The present disclosure relates to a radio-frequency (RF) module and a communication device.

2. Description of the Related Art

Mobile communication devices, such as mobile phones, include a power amplifier that amplifies RF transmission signals. Japanese Unexamined Patent Application Publication No. 2018-137522 discloses a front-end circuit (RF module) including a power amplifier (PA) circuit (transmission amplifier circuit) that transmits an RF transmission signal and a low-noise amplifier (LNA) circuit (reception amplifier circuit) that transmits an RF reception signal. The transmission amplifier circuit includes a PA control unit that controls an amplification characteristic of a power amplifier, whereas the reception amplifier circuit includes an LNA control unit that controls an amplification characteristic of a low-noise amplifier.

SUMMARY

As recognized by the present inventor, in the RF module disclosed in Japanese Unexamined Patent Application Publication No. 2018-137522, heat generated by the power amplifier that outputs a high-power transmission signal causes a local increase in temperature in the transmission amplifier circuit and causes variations in temperature between the power amplifier and the PA control unit, resulting in degradation of an output characteristic of the power amplifier.

Accordingly, it is an aspect of the present disclosure to provide a radio-frequency module and a communication device in which degradation of an output characteristic of a power amplifier is suppressed.

According to embodiments of the present disclosure, a radio-frequency module includes a module substrate, a power amplifier, and a control circuit configured to control the power amplifier. The control circuit includes a temperature sensor. The power amplifier and the control circuit are stacked one on top of another on a principal surface of the module substrate.

According to the embodiments of the present disclosure, it is possible to provide a radio-frequency module and a communication device in which degradation of an output characteristic of a power amplifier is suppressed.

Other features, elements, characteristics, and advantages of the present disclosure will become more apparent from the following detailed description of embodiments of the present disclosure with reference to the attached drawings.

BRIEF DESCRIPTION OF THE DRAWINGS

FIG. 2A is a schematic plan view of the configuration of a radio-frequency module according to an example;

DESCRIPTION OF THE EMBODIMENTS

Figure 1:
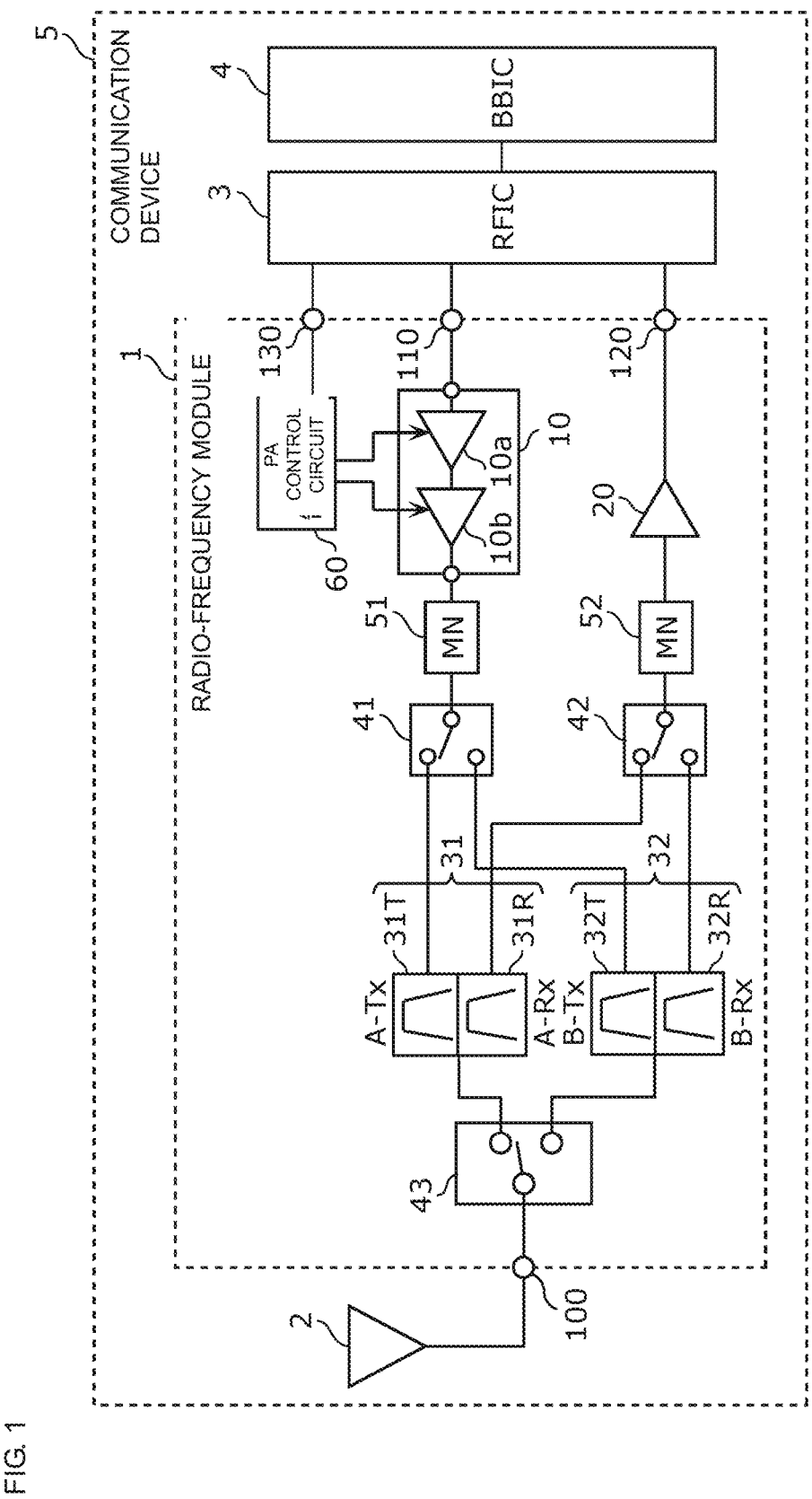
FIG. 1 is a circuit configuration diagram of a radio-frequency module and a communication device according to an embodiment.

Hereinafter, an embodiment of the present disclosure will be described in detail. The embodiment described below illustrates a general or specific example. The numerical values, shapes, materials, elements, the disposition and connection manner of the elements, and so forth described in the following embodiment are merely examples and are not intended to limit the present disclosure. Elements not described in the independent claims among the elements in the following example and modification example will be described as optional elements. The sizes of the elements illustrated in the drawings or the ratios between the sizes are not necessarily exact. In the drawings, elements that are substantially the same are denoted by the same reference numerals, and duplicate description may be omitted or simplified.

In the following description, terminology representing the relationship between elements, such as parallel and vertical, terminology representing the shape of an element, such as rectangular, and the range of a numerical value mean not only an exact relationship, an exact shape, and an exact range, respectively, but also a substantially equivalent relationship, a substantially equivalent shape, and a substantially equivalent range, respectively, and a difference of about several %, for example, is included.

In the following description, regarding A, B, and C mounted on a substrate, "C is disposed between A and B in plan view of the substrate (or a principal surface of the substrate)" means that at least one of a plurality of line segments connecting certain points in A and certain points in B passes through the region of C in plan view of the substrate. "In plan view of the substrate" means that the substrate and circuit elements mounted on the substrate are viewed in orthogonal projection on a plane parallel to the principal surface of the substrate.

In the following description, a "transmission path" means a transmission line constituted by a wiring line through which a radio-frequency transmission signal propagates, an electrode directly connected to the wiring line, a terminal directly connected to the wiring line or the electrode, and so forth. A "reception path" means a transmission line constituted by a wiring line through which a radio-frequency reception signal propagates, an electrode directly connected to the wiring line, a terminal directly connected to the wiring line or the electrode, and so forth. A "transmission/reception path" means a transmission line constituted by a wiring line through which a radio-frequency transmission signal and a radio-frequency reception signal propagate, an electrode directly connected to the wiring line, a terminal directly connected to the wiring line or the electrode, and so forth.

Embodiment

1. Circuit Configuration of Radio-Frequency Module 1 and Communication Device 5

FIG. 1 is a circuit configuration diagram of a radio-frequency frequency (RF) module 1 and a communication device 5 according to an embodiment. As illustrated in FIG. 1, the communication device 5 includes the RF module 1, an antenna 2, an RF signal processing circuit (RF integrated circuit (RFIC)) 3, and a baseband signal processing circuit (baseband integrated circuit (BBIC)) 4.

The RFIC 3 is an RF signal processing circuit that processes an RF signal that is to be transmitted by the antenna 2 or that has been received by the antenna 2. Specifically, the RFIC 3 performs signal processing, such as down-conversion, on a reception signal received through a reception path of the RF module 1, and outputs the reception signal subjected to the signal processing to the BBIC 4. In addition, the RFIC 3 performs signal processing, such as up-conversion, on a transmission signal received from the BBIC 4, and outputs the transmission signal subjected to the signal processing to a transmission path of the RF module 1. In this exemplary configuration the communication apparatus 5 is a multi-band transceiver. As used in this specification the term "module", as used with "radio frequency module", or "RF front-end module" should be construed as circuitry (programmable, as well as discrete) and associated circuit components, such as circuit boards, RF shielding, etc.

The BBIC 4 is a circuit that performs signal processing by using an intermediate frequency band lower than the frequency of an RF signal transmitted in the RF module 1. A signal processed by the BBIC 4 is used as, for example, an image signal for displaying an image or an audio signal for a call performed via a speaker.

The RFIC 3 also functions as a control unit that controls, on the basis of a communication band (frequency band) that is used, connections of switches 41, 42, and 43 included in the RF module 1. Specifically, the RFIC 3 switches connections of the switches 41 to 43 included in the RF module 1 by using control signals (not illustrated). Specifically, the RFIC 3 outputs digital control signals for controlling the switches 41 to 43 to a power amplifier (PA) control circuit 60. In response to the digital control signals received from the RFIC 3, the PA control circuit 60 of the RF module 1 outputs digital control signals to the switches 41 to 43, thereby controlling connections and non-connections of the switches 41 to 43.

The RFIC 3 also functions as a control unit (or controller, or control circuitry) that controls the gains of amplifying elements 10a and 10b of a power amplifier 10 included in the RF module 1. Specifically, the RFIC 3 outputs digital control signals of Mobile Industry Processor Interface (MIPI), General-Purpose Input/Output (GPIO), and the like, to a control signal terminal 130 of the RF module 1. The RFIC 3 also outputs a direct-current (DC) voltage signal VDC for a power supply voltage Vcc and a bias voltage Vbias that are to be supplied to the amplifying elements 10a and 10b to the control signal terminal 130 of the RF module 1. The PA control circuit 60 of the RF module 1 adjusts the gains of the amplifying elements 10a and 10b by using the digital control signals and the DC voltage signal received via the control signal terminal 130. Alternatively, a control signal terminal that outputs the digital control signals of MIPI, GPIO, and the like, and a control signal terminal that outputs the DC voltage signal VDC, may be different from each other. Alternatively, the control unit may be disposed outside the RFIC 3, for example, in the BBIC 4.

The antenna 2 is connected to an antenna connection terminal 100 of the RF module 1, radiates an RF signal output from the RF module 1, and receives an RF signal from the outside and outputs the RF signal to the RF module 1.

In the communication device 5 according to the present embodiment, the antenna 2 and the BBIC 4 are not essential elements.

Next, a detailed configuration of the RF module 1 will be described.

As illustrated in FIG. 1, the RF module 1 includes the antenna connection terminal 100, a transmission input terminal 110, a reception output terminal 120, the control signal terminal 130, the power amplifier 10, a low-noise amplifier 20, the PA control circuit 60, transmission filters 31T and 32T, reception filters 31R and 32R, matching circuits 51 and 52, and the switches 41, 42, and 43.

The antenna connection terminal 100 is connected to the antenna 2.

The power amplifier 10 is a transmission amplifier capable of amplifying RF signals of a communication band A and a communication band B received from the transmission input terminal 110. The power amplifier 10 includes the amplifying elements 10a and 10b that are cascade-connected. The power amplifier 10 may include a single amplifying element or may include three or more amplifying elements that are cascade-connected. Alternatively, the RF module 1 may include, instead of the power amplifier 10, a first power amplifier that amplifies an RF signal of the communication band A and a second power amplifier that amplifies an RF signal of the communication band B.

The power amplifier 10 may be a transmission amplifier capable of outputting a high-power transmission signal compatible with a high-power mobile station (high power user equipment (HPUE). Alternatively, the power amplifier 10 may be a so-called differential power amplifier including two amplifying elements and an output transformer. Alternatively, the power amplifier 10 may be a so-called Doherty power amplifier including a carrier amplifier, a peak amplifier, and a phase circuit.

The PA control circuit 60 adjusts the gains of the amplifying elements 10a and 10b included in the power amplifier 10 by using digital control signals MIPI and GPIO and a DC voltage signal received via the control signal terminal 130. The PA control circuit 60 may be formed of a semiconductor integrated circuit (IC). The semiconductor IC is composed of, for example, complementary metal oxide semiconductor (CMOS). Specifically, the semiconductor IC is formed by a silicon on insulator (SOI) process. Accordingly, the semiconductor IC can be manufactured at low cost. Alternatively, the semiconductor IC may be composed of at least any one of GaAs, SiGe, and GaN. This makes it possible to output an RF signal having high-quality amplification performance and noise performance.

The PA control circuit 60 includes a temperature sensor, a bias circuit that supplies a bias current to the power amplifier 10, and a compensation circuit that compensates for a bias current in accordance with a temperature detected by the temperature sensor.

The low-noise amplifier 20 is a reception amplifier that is capable of amplifying RF signals of the communication bands A and B with low noise and that outputs the RF signals to the reception output terminal 120. The RF module 1 may include a plurality of low-noise amplifiers. For example, the RF module 1 may include a first low-noise amplifier that amplifies an RF signal of the communication band A and a second low-noise amplifier that amplifies an RF signal of the communication band B.

The power amplifier 10 and the low-noise amplifier 20 are each constituted by a field-effect transistor (FET), a heterojunction bipolar transistor (HBT), or the like composed of, for example, Si-based CMOS or GaAs.

The transmission filter 31T is disposed on a transmission path that connects the transmission input terminal 110 and the antenna connection terminal 100, and allows a transmission signal of the transmission band of the communication band A among transmission signals amplified by the power amplifier 10 to pass therethrough. The transmission filter 32T is disposed on a transmission path that connects the transmission input terminal 110 and the antenna connection terminal 100, and allows a transmission signal of the transmission band of the communication band B among transmission signals amplified by the power amplifier 10 to pass therethrough.

The reception filter 31R is disposed on a reception path that connects the reception output terminal 120 and the antenna connection terminal 100, and allows a reception signal of the reception band of the communication band A among reception signals input from the antenna connection terminal 100 to pass therethrough. The reception filter 32R is disposed on a reception path that connects the reception output terminal 120 and the antenna connection terminal 100, and allows a reception signal of the reception band of the communication band B among reception signals input from the antenna connection terminal 100 to pass therethrough.

The transmission filter 31T and the reception filter 31R constitute a duplexer 31 whose pass band is the communication band A. The duplexer 31 transmits a transmission signal and a reception signal of the communication band A by using a frequency division duplex (FDD) scheme. The transmission filter 32T and the reception filter 32R constitute a duplexer 32 whose pass band is the communication band B. The duplexer 32 transmits a transmission signal and a reception signal of the communication band B by using the FDD scheme.

Alternatively, each of the duplexers 31 and 32 may be a multiplexer constituted by only a plurality of transmission filters, a multiplexer constituted by only a plurality of reception filters, or a multiplexer constituted by a plurality of duplexers. Alternatively, the transmission filter 31T and the reception filter 31R need not necessarily constitute the duplexer 31, and each of which may be a single filter that performs transmission by using a time division duplex (TDD) scheme. In this case, a switch that switches between transmission and reception is disposed in at least one of the preceding stage and the subsequent stage of the single filter. Likewise, the transmission filter 32T and the reception filter 32R need not necessarily constitute the duplexer 32, and each of which may be a single filter that performs transmission by using the TDD scheme.

Each of the transmission filters 31T and 32T and reception filters 31R and 32R may be, for example, any one of an acoustic wave filter using a surface acoustic wave (SAW), an acoustic wave filter using a bulk acoustic wave (BAW), an LC resonance filter, and a dielectric filter, and is furthermore not limited thereto.

The matching circuit 51 is an example of an impedance matching circuit, is disposed on a transmission path that connects the power amplifier 10 and the switch 41, and achieves impedance matching between the power amplifier 10 and the switch 41 and between the power amplifier 10 and the duplexers 31 and 32. The matching circuit 52 is disposed on a reception path that connects the low-noise amplifier 20 and the switch 42, and achieves impedance matching between the low-noise amplifier 20 and the switch 42 and between the low-noise amplifier 20 and the duplexers 31 and 32.

The switch 41 is connected to an output terminal of the power amplifier 10 via the matching circuit 51 and includes a common terminal, a first selection terminal, and a second selection terminal. The common terminal of the switch 41 is connected to the output terminal of the power amplifier 10 via the matching circuit 51. The first selection terminal of the switch 41 is connected to the transmission filter 31T, and the second selection terminal of the switch 41 is connected to the transmission filter 32T. With this connection configuration, the switch 41 switches between connection and non-connection between the power amplifier 10 and the transmission filter 31T and switches between connection and non-connection between the power amplifier 10 and the transmission filter 32T. The switch 41 is constituted by, for example, a single pole double throw (SPDT) switch circuit.

The switch 42 is connected to an input terminal of the low-noise amplifier 20 via the matching circuit 52 and includes a common terminal, a first selection terminal, and a second selection terminal. The common terminal of the switch 42 is connected to the input terminal of the low-noise amplifier 20 via the matching circuit 52. The first selection terminal of the switch 42 is connected to the reception filter 31R, and the second selection terminal of the switch 42 is connected to the reception filter 32R. With this connection configuration, the switch 42 switches between connection and non-connection between the low-noise amplifier 20 and the reception filter 31R and switches between connection and non-connection between the low-noise amplifier 20 and the reception filter 32R. The switch 42 is constituted by, for example, an SPDT switch circuit.

The switch 43 is an example of an antenna switch that switches between connection and non-connection between the antenna connection terminal 100 and the duplexer 31 and switches between connection and non-connection between the antenna connection terminal 100 and the duplexer 32. The switch 43 includes a common terminal, a first selection terminal, and a second selection terminal. The common terminal of the switch 43 is connected to the antenna connection terminal 100, the first selection terminal of the switch 43 is connected to the duplexer 31, and the second selection terminal of the switch 43 is connected to the duplexer 32. The switch 43 is constituted by, for example, an SPDT switch circuit.

The numbers of common terminals and selection terminals included in the switches 41 to 43 are appropriately set in accordance with the number of signal paths included in the RF module 1.

The switches 41 to 43 are included in a semiconductor IC formed of a single chip. The semiconductor IC is composed of, for example, CMOS. Specifically, the semiconductor IC is formed by an SOI process. Accordingly, the semiconductor IC can be manufactured at low cost. Alternatively, the semiconductor IC may be composed of at least any one of GaAs, SiGe, and GaN. The semiconductor IC may include the low-noise amplifier 20. In a case where the semiconductor IC includes an amplifier, it is possible to output an RF signal having high-quality amplification performance and noise performance.

In the configuration of the RF module 1, the power amplifier 10, the matching circuit 51, the switch 41, the transmission filter 31T, and the switch 43 constitute a first transmission circuit that transmits a transmission signal of the communication band A toward the antenna connection terminal 100. The switch 43, the reception filter 31R, the switch 42, the matching circuit 52, and the low-noise amplifier 20 constitute a first reception circuit that transmits a reception signal of the communication band A from the antenna 2 via the antenna connection terminal 100. The power amplifier 10, the matching circuit 51, the switch 41, the transmission filter 32T, and the switch 43 constitute a second transmission circuit that transmits a transmission signal of the communication band B toward the antenna connection terminal 100. The switch 43, the reception filter 32R, the switch 42, the matching circuit 52, and the low-noise amplifier 20 constitute a second reception circuit that transmits a reception signal of the communication band B from the antenna 2 via the antenna connection terminal 100.

With the above-described circuit configuration, the RF module 1 is capable of performing at least any one of transmission, reception, and transmission-and-reception of an RF signal of either the communication band A or the communication band B. Furthermore, the RF module 1 is capable of performing at least any one of simultaneous transmission, simultaneous reception, and simultaneous transmission-and-reception of RF signals of the communication band A and the communication band B.

In an RF module according to an embodiment of the present disclosure, the above-described two transmission circuits and the above-described two reception circuits need not necessarily be connected to the antenna connection terminal 100 via the switch 43, and may be connected to the antenna 2 via different terminals.

It is sufficient that an RF module according to an embodiment of the present disclosure at least include, in the circuit configuration of the RF module 1 illustrated in FIG. 1, the power amplifier 10 and the PA control circuit 60.

In the RF module 1, heat generated by the power amplifier 10 that outputs a high-power transmission signal may cause a local increase in temperature in the power amplifier 10. In this case, if variations in temperature occur between the power amplifier 10 and the PA control circuit 60, an appropriate bias current, an appropriate power supply voltage, and the like corresponding to the temperature of the power amplifier 10 are not supplied from the PA control circuit 60 to the power amplifier 10, resulting in degradation of an output characteristic of the power amplifier 10.

Hereinafter, a description will be given of the configuration of the RF module 1 in which degradation of an output characteristic of the power amplifier 10 is suppressed.

2. Layout of Circuit Elements of RF Module 1A According to Example

Figure 2B:
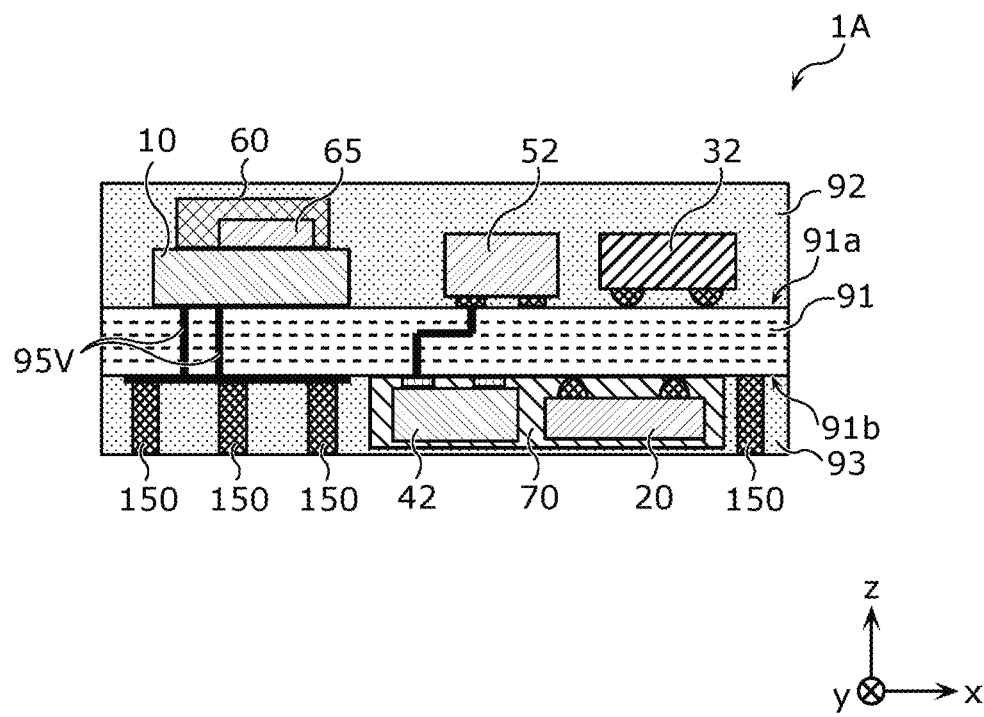
FIG. 2B is a schematic sectional view of the configuration of the radio-frequency module according to the example.

FIG. 2A is a schematic plan view of the configuration of an RF module 1A according to an example. FIG. 2B is a schematic sectional view of the configuration of the RF module 1A according to the example, and specifically is a sectional view taken along line IIB-IIB in FIG. 2A. Part (a) of FIG. 2A illustrates the layout of circuit elements when a principal surface 91a of principal surfaces 91a and 91b that face each other of a module substrate 91 is viewed from a z-axis positive direction. On the other hand, part (b) of FIG. 2A illustrates a perspective view of the layout of circuit elements when the principal surface 91b is viewed from the z-axis positive direction.

The RF module 1A according to the present example specifically illustrates the layout of the individual circuit elements constituting the RF module 1 according to the embodiment.

As illustrated in FIG. 2A and FIG. 2B, the RF module 1A according to the present example includes, in addition to the circuit elements illustrated in FIG. 1, the module substrate 91, resin members 92 and 93, and external connection terminals 150.

The module substrate 91 is a substrate having the principal surface 91a (first principal surface) and the principal surface 91b (second principal surface) that face each other, and the above-described transmission circuits and reception circuits are mounted thereon. As the module substrate 91, for example, a low temperature co-fired ceramics (LTCC) substrate or high temperature co-fired ceramics (HTCC) substrate having a multilayer structure of a plurality of dielectric layers, a component built-in substrate, a substrate having a redistribution layer (RDL), a printed circuit board, or the like is used.

The resin member 92 is disposed on the principal surface 91a of the module substrate 91, covers part of the above-described transmission circuits, part of the above-described reception circuits, and the principal surface 91a of the module substrate 91, and has a function of ensuring reliability, such as mechanical strength and moisture resistance, of circuit elements constituting the above-described transmission circuits and reception circuits. The resin member 93 is disposed on the principal surface 91b of the module substrate 91, covers part of the above-described transmission circuits, part of the above-described reception circuits, and the principal surface 91b of the module substrate 91, and has a function of ensuring reliability, such as mechanical strength and moisture resistance, of circuit elements constituting the above-described transmission circuits and reception circuits. The resin members 92 and 93 are not essential elements of an RF module according to an embodiment of the present disclosure.

As illustrated in FIG. 2A and FIG. 2B, in the RF module 1A according to the present example, the power amplifier 10, the PA control circuit 60, the duplexers 31 and 32, and the matching circuits 51 and 52 are disposed on the principal surface 91a (first principal surface). On the other hand, the switches 41 to 43 and the low-noise amplifier 20 are disposed on the principal surface 91b (second principal surface).

Although not illustrated in FIG. 2A, the wiring lines constituting the transmission paths and the reception paths that connect the circuit components illustrated in FIG. 1 are disposed in the module substrate 91 and on the principal surfaces 91a and 91b. The wiring lines may be bonding wires whose both ends are joined to the principal surfaces 91a and 91b and any one of the circuit elements constituting the RF module 1A, or may be terminals, electrodes, or wiring lines disposed on surfaces of the circuit elements constituting the RF module 1A.

The PA control circuit 60 includes a temperature sensor 65 as illustrated in part (a) of FIG. 2A and FIG. 2B.

As illustrated in part (a) of FIG. 2A and FIG. 2B, the power amplifier 10 and the PA control circuit 60 are stacked one on top of another on the principal surface 91a of the module substrate 91.

In the RF module 1, heat generated by the power amplifier 10 that outputs a high-power transmission signal may cause a local increase in temperature in the power amplifier 10. In this case, if variations in temperature occur between the power amplifier 10 and the PA control circuit 60, an appropriate bias current, an appropriate power supply voltage, and the like corresponding to the temperature of the power amplifier 10 are not supplied from the PA control circuit 60 to the power amplifier 10. In this case, an output characteristic of the power amplifier 10 degrades.

To address this, in the RF module 1A according to the present example, the power amplifier 10 and the PA control circuit 60 are stacked one on top of another on the principal surface 91a of the module substrate 91. With this configuration, the power amplifier 10 and the PA control circuit 60 including the temperature sensor 65 are disposed close to each other, and thus the temperature sensor 65 is capable of measuring the temperature of the power amplifier 10 with high accuracy when the power amplifier 10 generates heat. This enables the PA control circuit 60 to supply the power amplifier 10 with an appropriate bias current, an appropriate power supply voltage, and the like corresponding to the temperature of the power amplifier 10. Thus, degradation of an output characteristic of the power amplifier 10 can be suppressed.

It is desired that the temperature sensor 65 be in contact with the power amplifier 10.

With this disposition, the temperature sensor 65 is capable of measuring the temperature of the power amplifier 10 with higher accuracy.

The PA control circuit 60 may include a bias circuit that supplies a bias current to the power amplifier 10 and a compensation circuit that compensates for a bias current in accordance with a temperature detected by the temperature sensor 65.

With this configuration, the bias circuit of the PA control circuit 60 is capable of supplying the power amplifier 10 with the bias current compensated for by the compensation circuit.

In the RF module 1A according to the present example, the power amplifier 10 includes the amplifying elements 10a and 10b that are cascade-connected. As illustrated in part (a) of FIG. 2A, in plan view of the module substrate 91, the PA control circuit 60 overlaps the amplifying element 10b disposed in the last stage among the amplifying elements 10a and 10b.

In a case where a power amplifier includes a plurality of amplifying elements that are cascade-connected, heat generated by the amplifying element disposed in the last stage is dominant in heat generated by the power amplifier. From this point of view, in the RF module 1A according to the present example, the PA control circuit 60 overlaps the amplifying element 10b disposed in the last stage in the plan view and is thus capable of effectively measuring the temperature of the power amplifier 10 with high accuracy by using the temperature sensor 65.

It is desired that the temperature sensor 65 be in contact with the amplifying element 10b. With this disposition, the temperature of the power amplifier 10 can be measured with highest accuracy.

As illustrated in part (b) of FIG. 2A, the switches 41 to 43 and the low-noise amplifier 20 are included in a semiconductor IC 70 formed of a single chip (also referred to as a die). The state in which a plurality of circuit elements are included in a semiconductor IC formed of a single chip is defined as a state in which the plurality of circuit elements are disposed on or in a single semiconductor substrate or a state in which the plurality of circuit elements are integrally disposed in a single package. The single semiconductor substrate and the single package are different from the module substrate 91 and are different from an external substrate on which the RF module 1A is mounted.

According to the above-described configuration, the switches 41 to 43 and the low-noise amplifier 20 are included in the semiconductor IC 70 formed of a single chip, and thus a reduction in the size of the RF module 1A can be promoted.

In the RF module 1A according to the present example, the plurality of external connection terminals 150 are disposed on the principal surface 91b of the module substrate 91. The RF module 1A transmits electric signals to and receives electric signals from the external substrate disposed in a z-axis negative direction of the RF module 1A via the plurality of external connection terminals 150. As illustrated in part (b) of FIG. 2A, the external connection terminals 150 include the antenna connection terminal 100, the transmission input terminal 110, the reception output terminal 120, and the control signal terminal 130. Some of the external connection terminals 150 are set to the ground potential of the external substrate.

On the principal surface 91b that faces the external substrate among the principal surfaces 91a and 91b, the power amplifier 10, which is difficult to be reduced in profile, is not disposed, but the switches 41 to 43 and the low-noise amplifier 20, which can be easily reduced in profile, are disposed. Thus, the profile of the entire RF module 1A can be reduced. In addition, the plurality of external connection terminals 150 applied as ground electrodes are disposed around the low-noise amplifier 20 that has a great influence on the reception sensitivity of the reception circuit, and thus degradation of the reception sensitivity of the reception circuit can be suppressed.

In the RF module 1A, the power amplifier 10 is disposed on the principal surface 91a. The power amplifier 10 is a component that generates a large amount of heat among the circuit components included in the RF module 1A. To enhance the heat dissipation performance of the RF module 1A, it is important to dissipate heat generated by the power amplifier 10 to the external substrate via a heat dissipation path having a small thermal resistance. If the power amplifier 10 is mounted on the principal surface 91b, an electrode wiring line connected to the power amplifier 10 is disposed on the principal surface 91b. In this case, the heat dissipation path includes a heat dissipation path that passes through only a plane wiring pattern on the principal surface 91b (along the xy plane direction). The plane wiring pattern is formed of a metal thin-film and thus has a large thermal resistance. Thus, if the power amplifier 10 is disposed on the principal surface 91b, the heat dissipation performance decreases.

In contrast, in a case where the power amplifier 10 is disposed on the principal surface 91a, the power amplifier 10 can be connected to the external substrate via a ground via-conductor 95V extending between the principal surfaces 91a and 91b. Thus, it is possible to exclude, as the heat dissipation path for the power amplifier 10, a heat dissipation path that passes through only a plane wiring pattern along the xy plane direction having a large thermal resistance. Thus, it is possible to provide the RF module 1A that is compact and that has enhanced performance of heat dissipation from the power amplifier 10 to the external substrate.

In the RF module 1A according to the present example, the power amplifier 10 is disposed on the principal surface 91a, and the low-noise amplifier 20 is disposed on the principal surface 91b.

With this disposition, the power amplifier 10 that amplifies a transmission signal and the low-noise amplifier 20 that amplifies a reception signal are disposed separately on different surfaces of the module substrate 91, and thus isolation between transmission and reception is enhanced.

It is desired that the module substrate 91 have a multilayer structure including a plurality of laminated dielectric layers and that at least one of the plurality of dielectric layers have a ground electrode pattern. This configuration improves the electromagnetic field blockage function of the module substrate 91.

Figure 2C:
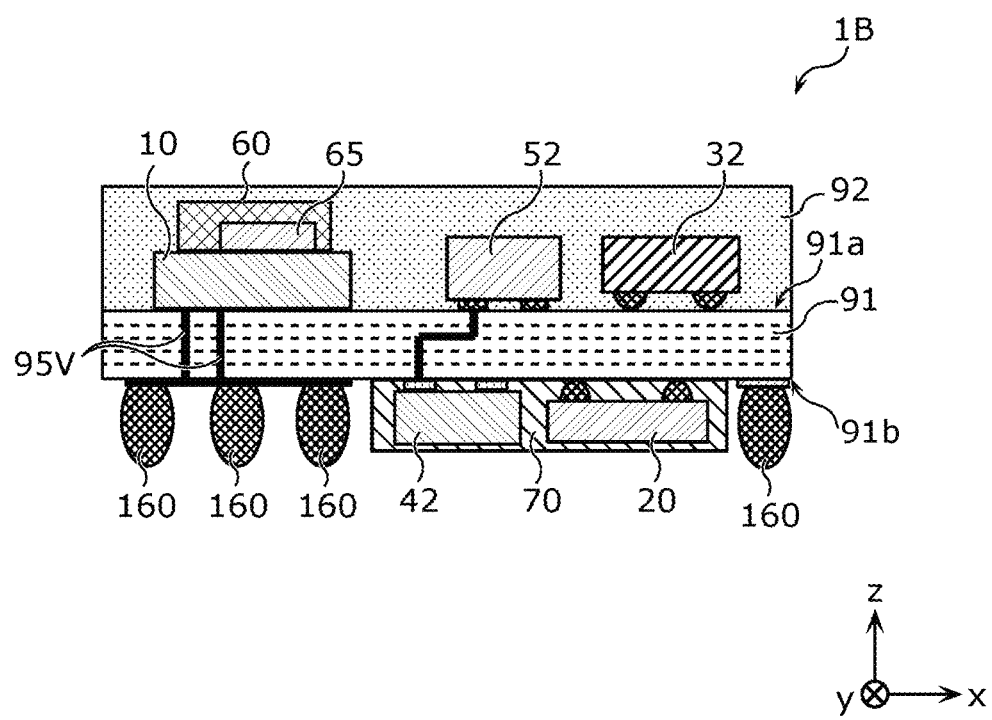
FIG. 2C is a schematic sectional view of the configuration of a radio-frequency module according to a modification example.

In the RF module 1A, each of the external connection terminals 150 may be a column-shaped electrode extending through the resin member 93 in the z-axis direction as illustrated in FIG. 2B. Alternatively, as in an RF module 1B according to a modification example illustrated in FIG. 2C, the external connection terminals 150 may be bump electrodes 160 disposed on the principal surface 91b. In this case, the resin member 93 on the principal surface 91b is not necessarily provided.

3. Advantages and The Like

As described above, the RF module 1 according to the present embodiment includes the module substrate 91, the power amplifier 10, and the PA control circuit 60 configured to control the power amplifier 10. The PA control circuit 60 includes the temperature sensor 65. The power amplifier 10 and the PA control circuit 60 are stacked one on top of another on a principal surface of the module substrate 91.

With this configuration, the power amplifier 10 and the PA control circuit 60 are stacked one on top of another on the principal surface of the module substrate 91. Accordingly, the power amplifier 10 and the PA control circuit 60 including the temperature sensor 65 are disposed close to each other, and thus the temperature sensor 65 is capable of measuring the temperature of the power amplifier 10 with high accuracy when the power amplifier 10 generates heat. This enables the PA control circuit 60 to supply the power amplifier 10 with an appropriate bias current, an appropriate power supply voltage, and the like corresponding to the temperature of the power amplifier 10. Thus, degradation of an output characteristic of the power amplifier 10 can be suppressed.

In the RF module 1, the power amplifier 10 may include the amplifying elements 10a and 10b that are cascade-connected, and the PA control circuit 60 may overlap the amplifying element 10b disposed in a last stage among the amplifying elements 10a and 10b in plan view of the module substrate 91.

With this configuration, the PA control circuit 60 overlaps the amplifying element 10b disposed in the last stage in the plan view and is thus capable of effectively measuring the temperature of the power amplifier 10 with high accuracy by using the temperature sensor 65.

In the RF module 1, the temperature sensor 65 may be in contact with the power amplifier 10.

With this disposition, the temperature sensor 65 is capable of measuring the temperature of the power amplifier 10 with higher accuracy.

In the RF module 1, the PA control circuit 60 may include the bias circuit configured to supply a bias current to the power amplifier 10, and the compensation circuit configured to compensate for the bias current in accordance with a temperature detected by the temperature sensor 65.

With this configuration, the bias circuit of the PA control circuit 60 is capable of supplying the power amplifier 10 with the bias current compensated for by the compensation circuit.

The RF module 1 may further include the low-noise amplifier 20, and the external connection terminals 150 configured to electrically connect the RF module 1 and the external substrate to each other. The module substrate 91 may have the principal surface 91a and the principal surface 91b that face each other. The power amplifier 10 and the PA control circuit 60 may be disposed on the principal surface 91a. The low-noise amplifier 20 and the external connection terminals 150 may be disposed on the principal surface 91b.

With this disposition, the power amplifier 10 and the low-noise amplifier 20 are disposed separately on different surfaces of the module substrate 91, and thus isolation between transmission and reception is enhanced. In addition, on the principal surface 91b that faces the external substrate, the power amplifier 10, which is difficult to be reduced in profile, is not disposed, but the low-noise amplifier 20, which can be easily reduced in profile, is disposed. Thus, the profile of the entire RF module 1 can be reduced.

The communication device 5 includes the antenna 2, the RFIC 3 configured to process an RF signal that is to be transmitted by the antenna 2 or that has been received by the antenna 2, and the RF module 1 configured to transmit the RF signal between the antenna 2 and the RFIC 3.

With this configuration, it is possible to provide the communication device 5 in which degradation of an output characteristic of the power amplifier 10 is suppressed.

Other Embodiments

The RF module and the communication device according to the embodiment of the present disclosure have been described above by using an embodiment, an example, and a modification example. An RF module and a communication device according to an embodiment of the present disclosure are not limited to the above-described embodiment, example, and modification example. Another embodiment implemented by combining certain elements in the above-described embodiment, example, and modification example; a modification example obtained by applying, to the above-described embodiment, example, and modification example, various modifications conceived of by a person skilled in the art without deviating from the gist of the present disclosure; and various apparatuses including the above-described RF module and communication device, are also included in the present disclosure.

For example, an RF module according to an embodiment of the present disclosure may have a configuration in which the power amplifier 10 and the PA control circuit 60 are stacked one on top of another on any one of the principal surfaces 91a and 91b of the module substrate 91, and the other circuit components constituting the RF module are disposed on only the one of the principal surfaces 91a and 91b. In other words, an RF module according to an embodiment of the present disclosure may have a configuration of being mounted on only one of principal surfaces of the module substrate 91.

For example, in the RF module and the communication device according to the above-described embodiment, example, and modification example, another circuit element, wiring line, and so forth may be disposed on a path that connects each circuit element and a signal path disclosed in the drawings.

An embodiment of the present disclosure can be widely used, in communication devices such as mobile phones, as an RF module disposed in a multiband-compatible front-end portion.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
a module substrate;
a power amplifier; and
a control circuit configured to control the power amplifier, wherein
the control circuit includes a temperature sensor,
a bottom surface of the temperature sensor is in direct physical contact with a top surface of the power amplifier,
top and side surfaces of the temperature sensor are in direct physical contact with the control circuit, a portion of the control circuit is in direct physical contact with the power amplifier and
the power amplifier is in direct physical contact with a top surface of the module substrate.

2. The radio-frequency module according to claim 1, wherein
the power amplifier includes a plurality of amplifying elements that are cascade-connected, and
from a plan view of the module substrate, the control circuit overlaps an amplifying element disposed in a last stage among the plurality of amplifying elements, and
the bottom surface of the temperature sensor is in direct physical contact only with a top surface of the last stage among the plurality of amplifying elements.

3. The radio-frequency module according to claim 2, wherein the control circuit includes
a bias circuit configured to supply a bias current to the power amplifier, and
a compensation circuit configured to compensate for the bias current in accordance with a temperature detected by the temperature sensor.

4. The radio-frequency module according to claim 2, further comprising:
a low-noise amplifier; and
an external connection terminal configured to electrically connect the radio-frequency module and an external substrate to each other, wherein
the module substrate has a first principal surface and a second principal surface on opposite sides of the module substrate,
the power amplifier and the control circuit are disposed on the first principal surface of the module substrate, and
the low-noise amplifier and the external connection terminal are disposed on the second principal surface of the module substrate.

5. The radio-frequency module according to claim 3, further comprising:
a low-noise amplifier; and
an external connection terminal configured to electrically connect the radio-frequency module and an external substrate to each other, wherein
the module substrate has a first principal surface and a second principal surface on opposite sides of the module substrate,
the power amplifier and the control circuit are disposed on the first principal surface of the module substrate, and
the low-noise amplifier and the external connection terminal are disposed on the second principal surface of the module substrate.

6. The radio-frequency module according to claim 1, wherein the control circuit includes
a bias circuit configured to supply a bias current to the power amplifier, and
a compensation circuit configured to compensate for the bias current in accordance with a temperature detected by the temperature sensor.

7. The radio-frequency module according to claim 6, wherein the control circuit includes
a bias circuit configured to supply a bias current to the power amplifier, and
a compensation circuit configured to compensate for the bias current in accordance with a temperature detected by the temperature sensor.

8. The radio-frequency module according to claim 7, further comprising:
a low-noise amplifier; and
an external connection terminal configured to electrically connect the radio-frequency module and an external substrate to each other, wherein
the module substrate has a first principal surface and a second principal surface on opposite sides of the module substrate,
the power amplifier and the control circuit are disposed on the first principal surface of the module substrate, and
the low-noise amplifier and the external connection terminal are disposed on the second principal surface of the module substrate.

9. The radio-frequency module according to claim 6, further comprising:
a low-noise amplifier; and
an external connection terminal configured to electrically connect the radio-frequency module and an external substrate to each other, wherein
the module substrate has a first principal surface and a second principal surface on opposite sides of the module substrate,
the power amplifier and the control circuit are disposed on the first principal surface of the module substrate, and
the low-noise amplifier and the external connection terminal are disposed on the second principal surface of the module substrate.

10. The radio-frequency module according to claim 1, further comprising:
a low-noise amplifier; and
an external connection terminal configured to electrically connect the radio-frequency module and an external substrate to each other, wherein
the module substrate has a first principal surface and a second principal surface on opposite sides of the module substrate,
the power amplifier and the control circuit are disposed on the first principal surface of the module substrate, and
the low-noise amplifier and the external connection terminal are disposed on the second principal surface of the module substrate.

11. The radio-frequency module according to claim 1, further comprising:
a thermal conductor passing through the module substrate so as to physically connect a bottom surface of the power amplifier to an external substrate via one or more external terminals embedded in a resin portion physically connected to a bottom surface of the module substrate.

12. The radio-frequency module according to claim 1, wherein top and side surfaces of the temperature sensor are in direct contact with the control circuit, and
a portion of the control circuit is in direct physical contact with the power amplifier.

13. A communication device comprising:
an antenna;
a radio-frequency signal processing circuit configured to process a radio-frequency signal that is to be transmitted by the antenna or that has been received by the antenna; and
a radio-frequency module configured to transmit the radio-frequency signal between the antenna and the radio-frequency signal processing circuit, the radio-frequency module including
a module substrate,
a power amplifier, and
a control circuit configured to control the power amplifier, wherein the control circuit includes a temperature sensor, a bottom surface of the temperature sensor is in direct physical contact with a top surface of the power amplifier, top and side surfaces of the temperature sensor are in direct physical contact with the control circuit, a portion of the control circuit is in direct physical contact with the power amplifier and the power amplifier is in direct physical contact with a top surface of the module substrate.

14. The communication device of claim 13, wherein the power amplifier includes a plurality of amplifying elements that are cascade-connected, from a plan view of the module substrate, the control circuit overlaps an amplifying element disposed in a last stage among the plurality of amplifying elements, and the bottom surface of the temperature sensor is in direct physical contact only with a top surface of the last stage among the plurality of amplifying elements.

15. The communication device of claim 13, further comprising:

a thermal conductor passing through the module substrate so as to physically connect a bottom surface of the power amplifier to an external substrate via one or more external terminals embedded in a resin portion physically connected to a bottom surface of the module substrate.

16. The communication device of claim 13, wherein top and side surfaces of the temperature sensor are in direct contact with the control circuit, and a portion of the control circuit is in direct physical contact with the power amplifier.

17. A radio-frequency module comprising:

a module substrate having a top surface and a bottom surface;

a power amplifier module comprising a plurality of amplifying elements that are cascade-connected, a portion of a bottom surface of the power amplifier module being in direct physical contact with the top surface of the module substrate;

a temperature sensor in direct physical contact with a top surface of only a last stage of the plurality of power amplifying elements, top and side surfaces of the temperature sensor being in direct physical contact with the control circuit;

a power amplifier control circuit module including a power amplifier control circuit, a portion of the power amplifier control circuit being in direct physical contact with the power amplifier, top and side surfaces of the temperature sensor being in direct physical contact with the power amplifier control circuit module;

a matching circuit module and a duplexer module each physically connected to the top surface of the module substrate, the duplexer module including plural transmission filters and plural reception filters, the matching circuit module including a transmission matching circuit and a reception matching module;

a switching module and a low noise amplifier (LNA) module each physical connected to the bottom surface of the module substrate substantially under the matching circuit module and the duplexer module that are physical connected to the top surface of the module substrate, the switching module including a plurality of switches controlled by the power amplifier control circuit so as to control electrical connections between the power amplifier module and the plural transmission filters via the matching circuit module, between the plural reception filters and the LNA module, and between the duplexer module and an antenna connection terminal;

a thermal conductor passing through the module substrate so as to physically connect a bottom surface of the power amplifier module to an external substrate via one or more external terminals embedded in a resin portion physically connected to the bottom surface of the module substrate; and external connection terminals including the antenna connection terminal, a transmission input terminal, a reception output terminal, and a control signal terminal, the external connection terminals being embedded in the resin portion and physically connected to the bottom surface of the module substrate, the external connection terminals configured to transmit and receive electric signals from the external substrate.

* * * * *